United States Patent
Liu

(10) Patent No.: US 11,817,882 B2
(45) Date of Patent: Nov. 14, 2023

(54) DECODING METHOD, DECODING DEVICE, AND READABLE STORAGE MEDIUM

(71) Applicant: TCL CHINA STAR OPTOELECTRONICS TECHNOLOGY CO., LTD., Guangdong (CN)

(72) Inventor: Jinfeng Liu, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 540 days.

(21) Appl. No.: 17/252,327

(22) PCT Filed: Nov. 30, 2020

(86) PCT No.: PCT/CN2020/132593
§ 371 (c)(1),
(2) Date: Dec. 15, 2020

(87) PCT Pub. No.: WO2022/095173
PCT Pub. Date: May 12, 2022

(65) Prior Publication Data
US 2022/0321256 A1    Oct. 6, 2022

(30) Foreign Application Priority Data
Nov. 9, 2020    (CN) .......................... 202011239084.6

(51) Int. Cl.
*H03M 7/00* (2006.01)
*H03M 13/37* (2006.01)

(52) U.S. Cl.
CPC .................. *H03M 13/37* (2013.01)

(58) Field of Classification Search
CPC . H03M 13/37; H04L 1/0045; H04N 21/4402; H04N 19/42
USPC ...................................... 341/50, 51
See application file for complete search history.

(56) References Cited

U.S. PATENT DOCUMENTS

| | | | |
|---|---|---|---|
| 2002/0011943 A1* | 1/2002 | Deeley | H04N 19/61 382/246 |
| 2004/0028140 A1* | 2/2004 | Sudharsanan | H04N 19/91 375/E7.184 |
| 2007/0285286 A1* | 12/2007 | Hussain | G06F 9/3895 341/50 |

(Continued)

FOREIGN PATENT DOCUMENTS

| | | |
|---|---|---|
| CN | 103973310 | 8/2014 |
| CN | 108777606 | 11/2018 |
| CN | 109165001 | 1/2019 |

(Continued)

*Primary Examiner* — Jean B Jeanglaude

(57) ABSTRACT

The present disclosure provides a decoding method, a decoding device, and a readable storage medium, which include performing an exclusive-or logic operation on a first identification bit and a second identification bit in a first bit stream to obtain a first operation result, and processing the first bit stream according to the first operation result to obtain a second bit stream; performing the exclusive-or logic operation on a third identification bit and a fourth identification bit in the second bit stream to obtain a second operation result, and processing the second bit stream according to the second operation result to obtain a third bit stream; and deleting two specific bits in the third bit stream to obtain a decoded bit.

20 Claims, 4 Drawing Sheets

(56) References Cited

U.S. PATENT DOCUMENTS

2009/0051573 A1*  2/2009  Tomita ................... H04N 19/12
                                                  341/67

FOREIGN PATENT DOCUMENTS

| CN | 110098837 | 8/2019 |
| CN | 110474709 | 11/2019 |
| CN | 110620635 | 12/2019 |
| JP | 2019-015916 | 1/2019 |

* cited by examiner

DECODING METHOD, DECODING DEVICE, AND READABLE STORAGE MEDIUM

RELATED APPLICATIONS

This application is a National Phase of PCT Patent Application No. PCT/CN2020/132593 having International filing date of Nov. 30, 2020, which claims the benefit of priority of Chinese Patent Application No. 202011239084.6 filed on Nov. 9, 2020. The contents of the above applications are all incorporated by reference as if fully set forth herein in their entirety.

FIELD AND BACKGROUND OF THE INVENTION

The present disclosure relates to the field of data transmission, and specifically to a decoding method, a decoding device, and a readable storage medium.

Decoding is a process of using a specific method to restore numerical codes to content they represent or to convert electrical pulse signals, optical signals, radio waves, or the like into information, data, or the like they represent. In data transmission technology, digital signals are encoded at a transmitting end, then are transmitted through a channel, and finally are received and decoded at a receiving end. IBM 8B/10B encoding is a commonly used encoding mechanism that can ensure that a transmitted data string is correctly restored at the receiving end.

SUMMARY OF THE INVENTION

For reliability and security of signal transmission, existing encoding methods are generally complicated, which causes data decoding speed to be too slow, thereby affecting signal transmission quality. Furthermore, since most of the existing decoding methods are complicated, and thus hardware cost of the implementation cannot be reduced. Therefore, it is necessary to provide a data decoding method to solve the above-mentioned problems.

In one aspect, an embodiment of the present disclosure provides a decoding method, comprising:
  performing an exclusive-or logic operation on a first identification bit and a second identification bit in a first bit stream to obtain a first operation result, and processing the first bit stream according to the first operation result to obtain a second bit stream;
  performing the exclusive-or logic operation on a third identification bit and a fourth identification bit in the second bit stream to obtain a second operation result, and processing the second bit stream according to the second operation result to obtain a third bit stream; and
  deleting two specific bits in the third bit stream to obtain a decoded bit stream.

In a possible implementation of the present disclosure, processing the first bit stream according to the first operation result to obtain the second bit stream comprises:
  when the first operation result is that the first identification bit is different from the second identification bit, the inversion logic operation is performed on a first specific bit in the first bit stream to obtain the second bit stream; and
  when the first operation result is that the first identification bit is same as the second identification bit, the first bit stream is used as the second bit stream.

In a possible implementation of the present disclosure, processing the first bit stream according to the first operation result to obtain the second bit stream comprises:
  when the first operation result is that the first identification bit is the same as the second identification bit, the inversion logic operation is performed on the first specific bit in a first bit stream to obtain the second bit stream; and
  when the first operation result is that the first identification bit is different from the second identification bit, the first bit stream is used as the second bit stream.

In a possible implementation of the present disclosure, the first specific bit is selected from last five bits of the first bit stream.

In a possible implementation of the present disclosure, processing the second bit stream according to the second operation result to obtain the third bit stream comprises:
  when the second operation result is that the third identification bit is different from the fourth identification bit, the inversion logic operation is performed on a second specific bit and a third specific bit in the second bit stream to obtain the third bit stream, and
  when the second operation result is that the third identification bit is same as the fourth identification bit, the inversion logic operation is performed on a fourth specific bit and a fifth specific bit in the second bit stream to obtain the third bit stream.

In a possible implementation of the present disclosure, processing the second bit stream according to the second operation result to obtain the third bit stream comprises:
  when the second operation result is that the third identification bit is same as the fourth identification bit, the inversion logic operation is performed on a second specific bit and a third specific bit in the second bit stream to obtain the third bit stream, and
  when the second operation result is that the third identification bit is different from the fourth identification bit, the inversion logic operation is performed on a fourth specific bit and a fifth specific bit in the second bit stream to obtain the third bit stream.

In a possible implementation of the present disclosure, the second specific bit, the third specific bit, the fourth specific bit and the fifth specific bit are selected from last five bits of the second bit stream, wherein the second specific bit is not adjacent to the third specific bit, and the fourth specific bit is not adjacent to the fifth specific bit.

In a possible implementation of the present disclosure, the first identification bit and the second identification bit are a 0th bit and a first bit in the first bit stream, respectively, and the first specific bit is a seventh bit in the first bit stream;
  the third identification bit and the fourth identification bit are a sixth bit and a seventh bit in the second bit stream, respectively; and
  the two specific bit in the third bit stream are a 0th bit and a third bit in the third bit stream, respectively.

In a second aspect, the present disclosure further provides a decoding device comprising a processor, wherein the processor is configured to execute instructions to achieve a decoding method, and the decoding method comprises:
  performing an exclusive-or logic operation on a first identification bit and a second identification bit in a first bit stream to obtain a first operation result, and processing the first bit stream according to the first operation result to obtain a second bit stream;
  performing the exclusive-or logic operation on a third identification bit and a fourth identification bit in the second bit stream to obtain a second operation result, and processing the second bit stream according to the second operation result to obtain a third bit stream; and deleting two specific bits in the third bit stream to obtain a decoded bit stream.

In a possible implementation of the present disclosure, processing the first bit stream according to the first operation result to obtain the second bit stream comprises:

when the first operation result is that the first identification bit is different from the second identification bit, the inversion logic operation is performed on a first specific bit in the first bit stream to obtain the second bit stream; and when the first operation result is that the first identification bit is same as the second identification bit, the first bit stream is used as the second bit stream.

In a possible implementation of the present disclosure, processing the first bit stream according to the first operation result to obtain the second bit stream comprises:

when the first operation result is that the first identification bit is same as the second identification bit, the inversion logic operation is performed on a first specific bit in the first bit stream to obtain the second bit stream; and when the first operation result is that the first identification bit is different from the second identification bit, the first bit stream is used as the second bit stream.

In a possible implementation of the present disclosure, the first specific bit is selected from last five bits of the first bit stream.

In a possible implementation of the present disclosure, processing the second bit stream according to the second operation result to obtain the third bit stream comprises:

when the second operation result is that the third identification bit is different from the fourth identification bit, the inversion logic operation is performed on a second specific bit and a third specific bit in the second bit stream to obtain the third bit stream, and when the second operation result is that the third identification bit is same as the fourth identification bit, the inversion logic operation is performed on a fourth specific bit and a fifth specific bit in the second bit stream to obtain the third bit stream.

In a possible implementation of the present disclosure, processing the second bit stream according to the second operation result to obtain the third bit stream comprises:

when the second operation result is that the third identification bit is same as the fourth identification bit, the inversion logic operation is performed on a second specific bit and a third specific bit in the second bit stream to obtain the third bit stream, and when the second operation result is that the third identification bit is different from the fourth identification bit, the inversion logic operation is performed on a fourth specific bit and a fifth specific bit in the second bit stream to obtain the third bit stream.

In a possible implementation of the present disclosure, the second specific bit, the third specific bit, the fourth specific bit and the fifth specific bit are selected from last five bits of the second bit stream, wherein the second specific bit is not adjacent to the third specific bit, and the fourth specific bit is not adjacent to the fifth specific bit.

In a possible implementation of the present disclosure, the first identification bit and the second identification bit are a 0th bit and a first bit in the first bit stream, respectively, and the first specific bit is a seventh bit in the first bit stream;

the third identification bit and the fourth identification bit are a sixth bit and a seventh bit in the second bit stream, respectively; and the two specific bit in the third bit stream are a 0th bit and a third bit in the third bit stream, respectively.

In a possible implementation of the present disclosure, the first identification bit and the second identification bit are a third bit and a fourth bit in the first bit stream, respectively; and the third identification bit and the fourth identification bit are a eighth bit and a ninth bit in the second bit stream, respectively.

In a possible implementation of the present disclosure, the first identification bit and the second identification bit are a 0th bit and a first bit in the first bit stream, respectively; and the third identification bit and the fourth identification bit are a first bit and a second bit in the second bit stream, respectively.

In a possible implementation of the present disclosure, wherein the second specific bit and the third specific bit are a sixth bit and a ninth bit in the second bit stream, respectively, and the fourth specific bit and the fifth specific bit are a fifth bit and a eighth bit in the second bit stream.

In a third aspect, the present disclosure further provides a readable storage medium storing instructions, wherein when the instructions are executed the decoding method described in the first implementation is implemented.

The present disclosure provides a decoding method. During decoding, only a simple exclusive-or logic operation is performed on the first identification bit and the second identification bit, and the third identification bit and the fourth identification bit in the original bit stream, a logic processing method on corresponding specific bits are determined according to the operation result, and corresponding processes are performed to obtain the final decoded bit stream. The whole decoding method has simple logic, which reduces complexity of design and improves reliability of the decoding.

DESCRIPTION OF SPECIFIC EMBODIMENTS OF THE INVENTION

Technical solutions in embodiments of the present disclosure will be clearly and completely described below in conjunction with drawings in the embodiments of the present disclosure. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

In the description of the present disclosure, it should be understood that the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

Figure 1:
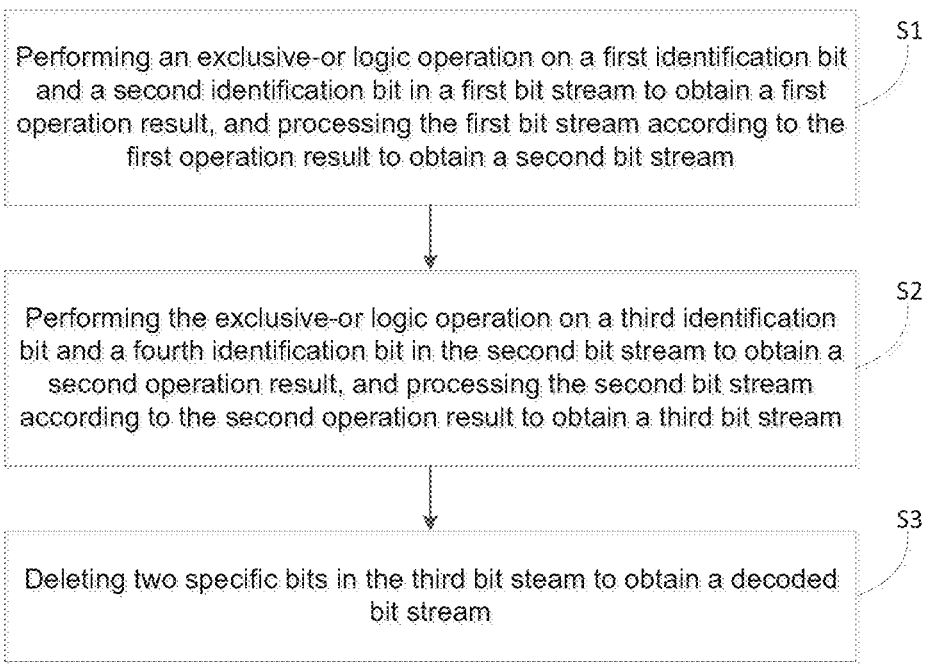
FIG. 1 is a flowchart of a decoding method provided in an embodiment of the present disclosure.
Figure 2:
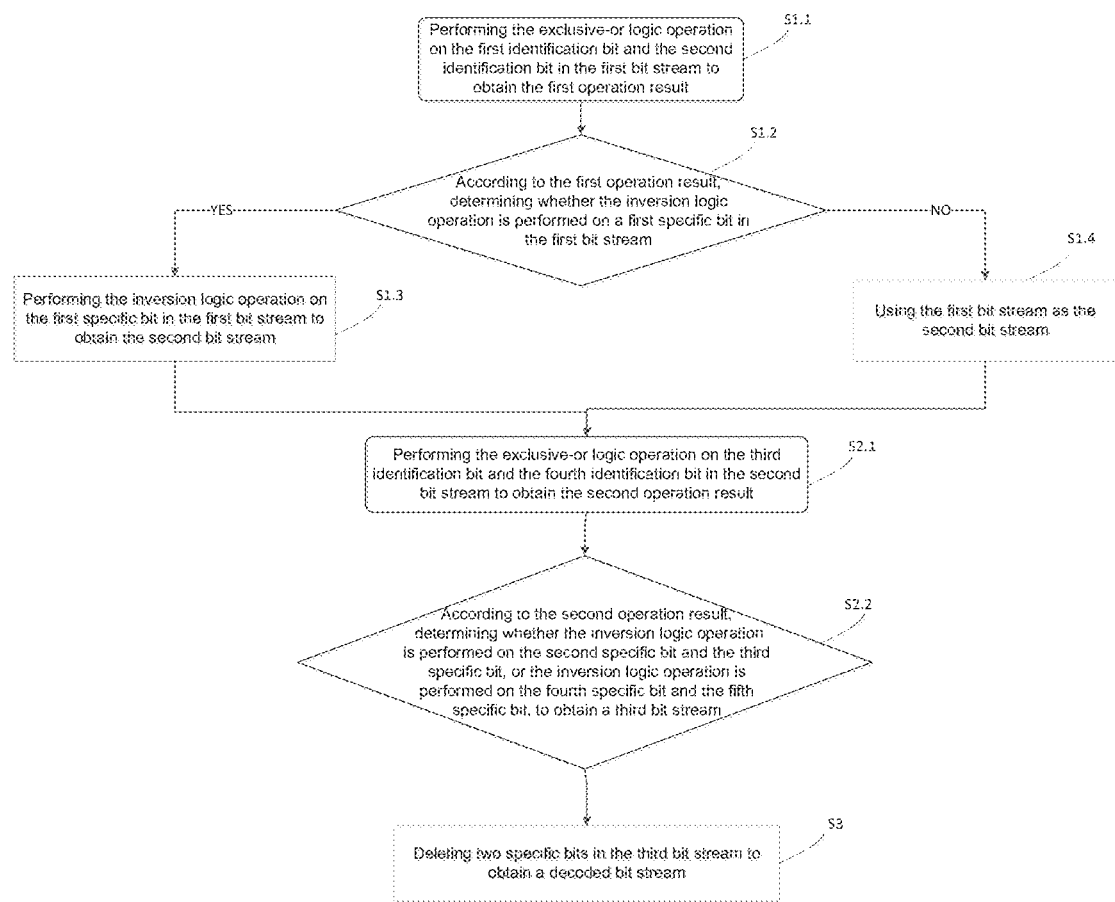
FIG. 2 is a detailed flowchart of the decoding method provided in an embodiment of the present disclosure.

An embodiment of the present disclosure provides a decoding method, a flowchart of the decoding method is shown in FIG. 1 and FIG. 2, and comprises the following steps:

S1: performing an exclusive-or logic operation on a first identification bit and a second identification bit in a first bit stream to obtain a first operation result, and processing the first bit stream according to the first operation result to obtain a second bit stream.

wherein, step S1 specifically comprises:

S1.1: performing the exclusive-or logic operation on the first identification bit and the second identification bit in the first bit stream to obtain the first operation result;

S1.2: according to the first operation result, determining whether an inversion logic operation is performed on a first specific bit in the first bit stream;

S1.3: if so, performing the inversion logic operation on the first specific bit in the first bit stream to obtain the second bit stream;

S1.4: if not, using the first bit stream as the second bit stream.

The first specific bit is selected from last five bits in the first bit stream.

Specifically, when the first operation result is that the first identification bit is different from the second identification bit, the inversion logic operation is performed on the first specific bit in the first bit stream to obtain the second bit stream. When the first operation result is that the first identification bit is the same as the second identification bit, the first bit stream is used as the second bit stream.

Or, when the first operation result is that the first identification bit is the same as the second identification bit, the inversion logic operation is performed on the first specific bit in the first bit stream to obtain the second bit stream. When the first operation result is that the first identification bit is different from the second identification bit, the first bit stream is used as the second bit stream.

Regarding determining whether the inversion logic operation is performed on the first specific bit in the first bit stream according to the first operation result, a specific decoding method can be selected from the above two methods according to preset rules, which is not limited herein.

S2: performing the exclusive-or logic operation on a third identification bit and a fourth identification bit in the second bit stream to obtain a second operation result, and processing the second bit stream according to the second operation result to obtain a third bit stream.

wherein, step S2 specifically comprises:

S2.1: performing the exclusive-or logic operation on the third identification bit and the fourth identification bit in the second bit stream to obtain the second operation result;

S2.2: according to the second operation result, determining whether the inversion logic operation is performed on the second specific bit and the third specific bit, or the inversion logic operation is performed on the fourth specific bit and the fifth specific bit, to obtain the third bit stream.

The second specific bit, the third specific bit, the fourth specific bit and the fifth specific bit are selected from last five bits of the second bit stream. The second specific bit is not adjacent to the third specific bit, and the fourth specific bit is not adjacent to the fifth specific bit.

Specifically, when the second operation result is that the third identification bit is different from the fourth identification bit, the inversion logic operation is performed on the second specific bit and the third specific bit in the second bit stream to obtain the third bit stream.

When the second operation result is that the third identification bit is the same as the fourth identification bit, the inversion logic operation is performed on the fourth identification bit and the fifth identification bit in the second bit stream to obtain the third bit stream.

Or, when the second operation result is that the third identification bit is the same as the fourth identification bit, the inversion logic operation is performed on the second specific bit and the third specific bit in the second bit stream to obtain the third bit stream.

When the second operation result is that the third identification bit is different from the fourth identification bit, the inversion logic operation is performed on the fourth identification bit and the fifth identification bit in the second bit stream to obtain the third bit stream.

Regarding whether the inversion logic operation is performed on the second specific bit and the third specific bit in the second bit stream or on the fourth specific bit and the fifth specific bit in the second bit stream according to the second operation result, a specific decoding method can be selected from the above two methods according to preset rules, which is not limited herein.

S3: deleting two specific bits in the third bit stream to obtain a decoded bit stream.

In the decoding method provided in the embodiment of the present disclosure, during decoding, only a simple exclusive-or logic operation is performed on the first identification bit and the second identification bit, and the third identification bit and the fourth identification bit in the original bit stream, a logic processing method on corresponding specific bits are determined according to the operation result, and corresponding processes are performed to obtain a final decoded bit stream. The whole decoding method has simple logic, which reduces complexity of design and improves reliability of the decoding.

In the embodiment of the present disclosure, the first identification bit and the second identification bit are respectively selected from the 0th bit and the first bit in the first bit stream, and the third identification bit and the fourth identification bit are respectively selected from the sixth bit and the seventh bit in the second bit stream. In the decoding method of the embodiment of the present disclosure, a position of each identification bit is not limited. The first identification bit and the second identification bit can also be selected from the third bit and the fourth bit in the first bit stream, and the third identification bit and the fourth identification bit are respectively selected from the eighth bit and the ninth bit in the second bit stream. Or, the first identification bit and the second identification bit are selected from the 0th bit and the first bit in the first bit stream, and the third identification bit and the fourth identification bit are respectively selected from the first bit and the second bit in the second bit stream.

In the embodiment of the present disclosure, the first specific bit is selected from the seventh bit in the first bit stream, the second specific bit and the third specific bit are respectively selected from the sixth bit and the ninth bit in the second bit stream, and the fourth specific bit and the fifth specific bit are respectively selected from the fifth bit and the eighth bit in the second bit stream. In some other embodiments of the present disclosure, according to preset rules, the second specific bit and the third specific bit may also be respectively selected from the fifth bit and the eighth bit in the second bit stream, and the fourth specific bit and the fifth specific bit are respectively selected from the sixth bit and the ninth bit in the second bit stream. Positions of the first specific bit, the second specific bit, the third specific bit, the fourth specific bit, and the fifth specific bit are not limited, but must be selected from last five bits of the corresponding bit stream.

In the embodiment of the present disclosure, the two specific bits in the third bit stream are the 0th bit and the third bit in the third bit stream. In some other embodiments of the present disclosure, a specific decoding method can select two specific bits in the third bit stream according to preset rules, which is not limited here.

Figure 3:
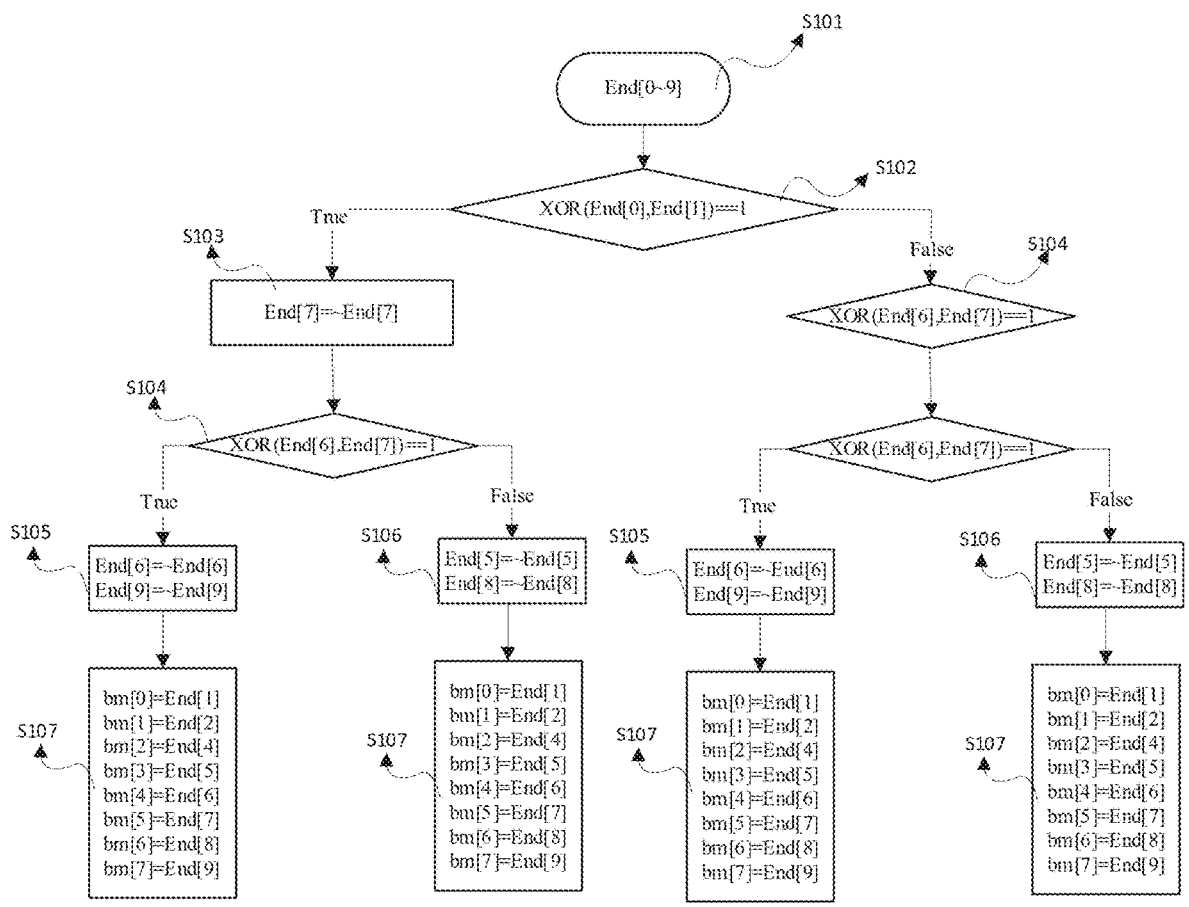
FIG. 3 is a specific flowchart of a decoding method provided in another specific embodiment of the present disclosure.

Taking data in the first bit stream including ten bits, and the final decoded bit stream including eight bits as an example, the decoding method in the embodiment of the present disclosure is described in detail. The flowchart as shown in FIG. 3 comprises:

S101: obtaining a first bit stream End[0~9].
S102: performing the exclusive-or logic operation on the 0th bit and the first bit in the first bit stream End[0~9], the "==" in the drawing means equal, if values of the 0th bit and the first bit are different, then go to step S103. If the values of the 0th bit is the same as the first bit, then go to step S104.
S103: performing the inversion logic operation on the seventh bit in the first bit stream End[0~9], and "~" in the drawing represents inversion.
S104: performing the exclusive-or logic operation on the sixth bit and the seventh bit in the first bit stream End[0~9]. If values of the sixth bit and the seventh bit are different, then go to step S105. If the values of the sixth bit and the seventh bit are the same, then go to step S106.
S105: performing the inversion logic operation on the sixth bit and the ninth bit in the first bit stream End[0~9], and then go to step S107.
S106: performing the inversion logic operation on the fifth bit and the eighth bit in the first bit stream End[0~9], and then go to step S107.
S107: ignoring the 0th bit and the third bit in the first bit stream End[0~9] and assigning them to a bit stream bm[0~7] in sequence, and the bit stream bm[0~7] is the final decoded bit stream.

In the specific embodiment, when the first operation result is 0 (that is, the 0th bit is the same as the first bit), it is determined that the inversion logic operation should not be performed on the first specific bit (that is, the seventh bit), and when the first operation result is 1 (that is, the 0th bit is different from the first bit), it is determined that the inversion logic operation should be performed on the first specific bit. In some other embodiments of the present disclosure, according to preset rules, when the first operation result is 0, it may be determined that the inversion logic operation should be performed on the first specific bit, and when the first operation result is 1, it may be determined that the inversion logic operation should not be performed on the first specific bit.

In the specific embodiment, when the second operation result is 1 (that is, the sixth bit is different from the seventh bit), the inversion logic operation is performed on the second specific bit and the third specific bit, and when the second operation result is 0 (that is, the sixth bit is the same with the seventh bit), the inversion logic operation is performed on the fourth specific bit and the fifth specific bit. In some other embodiments of the present disclosure, according to preset rules, when the second operation result is 0, the inversion logic operation may be performed on the second specific bit and the third specific bit, and when the second operation result is 1, the inversion logic operation may be performed on the fourth specific bit and the fifth specific bit.

Figure 4:
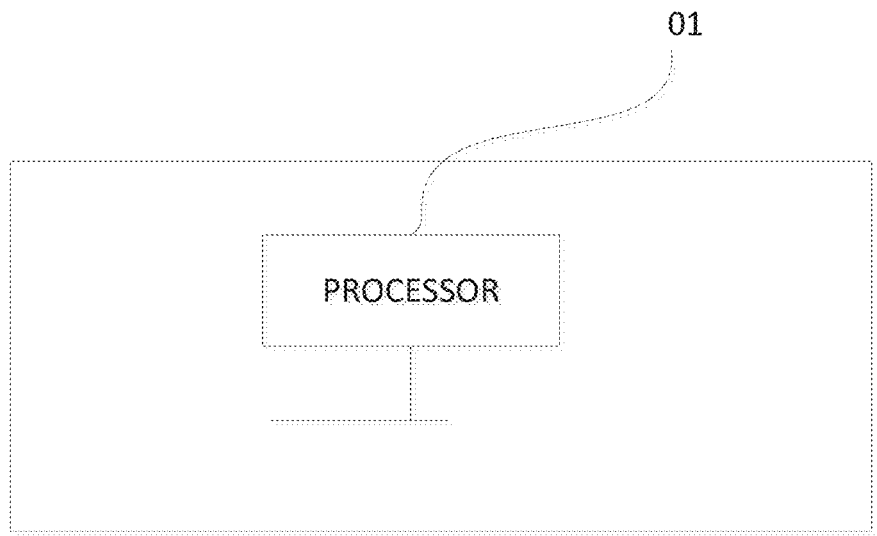
FIG. 4 is a schematic diagram of a decoding device provided in an embodiment of the present disclosure.

An embodiment of the present disclosure further provides a decoding device comprising a processor 01, and a schematic diagram is shown in FIG. 4. In addition, the decoding device may also comprise a memory (not shown in the drawing). The processor 01 controls operations of the decoding device and may be an integrated circuit chip with signal sequence processing capability. The processor 01 may also be a general purpose processor, a digital signal sequence processor (DSP), an application specific integrated circuit (ASIC), a field programmable gate array (FPGA) or other programmable logic devices, discrete gates or transistor logic devices, discrete hardware components. The general purpose processor may be a microprocessor, or the processor may also be any conventional processor or the like.

The processor 01 is configured to execute instructions to implement the decoding method provided in any embodiment and possible combination of the decoding methods described in the embodiments of the present disclosure. Definition of the decoding device may refer to the definition of the decoding method above, which is not limit herein.

Figure 5:
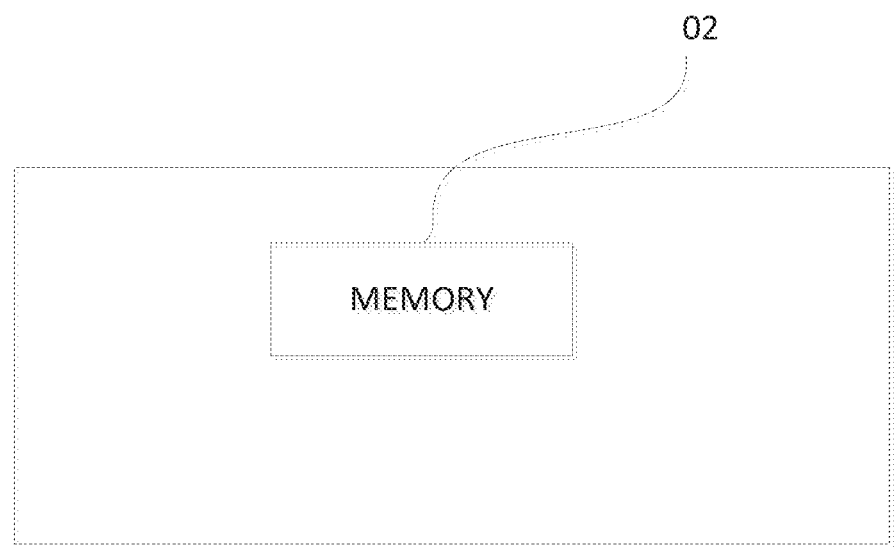
FIG. 5 is a schematic diagram of a readable storage medium provided in an embodiment of the present disclosure.

An embodiment of the present disclosure also provides a readable storage medium. A schematic diagram is shown in FIG. 5. The readable storage medium may comprise a memory 02 storing instructions. When the instructions are executed, decoding method provided by any one embodiment or possible combination of the decoding methods of the embodiments of the present disclosure is implemented. The memory 02 may comprises a read-only memory (ROM), a random access memory (RAM), a flash memory, a hard disk, an optical disk, and the like.

The above is a detailed introduction to a decoding method, a decoding device and a readable storage medium provided in the embodiments of the present disclosure. Specific examples are used in this article to illustrate the principles and implementations of the present disclosure. The descriptions of the above embodiments are only used to help understand the methods and core ideas of the present disclosure. At the same time, for those skilled in the art, according to the ideas of the present disclosure, there will be changes in the specific implementation and scope of the present disclosure. In summary, the content of this specification should not be construed as a limitation.

What is claimed is:
1. A decoding method, comprising:
performing an exclusive-or logic operation on a first identification bit and a second identification bit in a first bit stream to obtain a first operation result, and processing the first bit stream according to the first operation result to obtain a second bit stream;
performing the exclusive-or logic operation on a third identification bit and a fourth identification bit in the second bit stream to obtain a second operation result, and processing the second bit stream according to the second operation result to obtain a third bit stream; and
deleting two specific bits in the third bit stream to obtain a decoded bit stream.
2. The decoding method of claim 1, wherein processing the first bit stream according to the first operation result to obtain the second bit stream comprises:

when the first operation result is that the first identification bit is different from the second identification bit, an inversion logic operation is performed on a first specific bit in the first bit stream to obtain the second bit stream; and when the first operation result is that the first identification bit is same as the second identification bit, the first bit stream is used as the second bit stream.

3. The decoding method of claim 2, wherein the first specific bit is selected from last five bits of the first bit stream.

4. The decoding method of claim 1, wherein processing the first bit stream according to the first operation result to obtain the second bit stream comprises:

when the first operation result is that the first identification bit is same as the second identification bit, an inversion logic operation is performed on a first specific bit in the first bit stream to obtain the second bit stream; and when the first operation result is that the first identification bit is different from the second identification bit, the first bit stream is used as the second bit stream.

5. The decoding method of claim 4, wherein
the first identification bit and the second identification bit are a 0th bit and a first bit in the first bit stream, respectively, and the first specific bit is a seventh bit in the first bit stream;
the third identification bit and the fourth identification bit are a sixth bit and a seventh bit in the second bit stream, respectively; and
the two specific bits in the third bit stream are a 0th bit and a third bit in the third bit stream, respectively.

6. The decoding method of claim 1, wherein processing the second bit stream according to the second operation result to obtain the third bit stream comprises:

when the second operation result is that the third identification bit is different from the fourth identification bit, an inversion logic operation is performed on a second specific bit and a third specific bit in the second bit stream to obtain the third bit stream, and when the second operation result is that the third identification bit is same as the fourth identification bit, the inversion logic operation is performed on a fourth specific bit and a fifth specific bit in the second bit stream to obtain the third bit stream.

7. The decoding method of claim 6, wherein the second specific bit, the third specific bit, the fourth specific bit, and the fifth specific bit are selected from last five bits of the second bit stream, wherein the second specific bit is not adjacent to the third specific bit, and the fourth specific bit is not adjacent to the fifth specific bit.

8. The decoding method of claim 1, wherein processing the second bit stream according to the second operation result to obtain the third bit stream comprises:

when the second operation result is that the third identification bit is same as the fourth identification bit, an inversion logic operation is performed on a second specific bit and a third specific bit in the second bit stream to obtain the third bit stream, and when the second operation result is that the third identification bit is different from the fourth identification bit, the inversion logic operation is performed on a fourth specific bit and a fifth specific bit in the second bit stream to obtain the third bit stream.

9. A readable storage medium storing instructions, wherein when the instructions are executed, the decoding method of claim 1 is implemented.

10. A decoding device, comprising a processor, wherein the processor is configured to execute instructions to implement a decoding method, and the decoding method comprises:

performing an exclusive-or logic operation on a first identification bit and a second identification bit in a first bit stream to obtain a first operation result, and processing the first bit stream according to the first operation result to obtain a second bit stream;

performing the exclusive-or logic operation on a third identification bit and a fourth identification bit in the second bit stream to obtain a second operation result, and processing the second bit stream according to the second operation result to obtain a third bit stream; and deleting two specific bits in the third bit stream to obtain a decoded bit stream.

11. The decoding device of claim 10, wherein processing the first bit stream according to the first operation result to obtain the second bit stream comprises:

when the first operation result is that the first identification bit is different from the second identification bit, an inversion logic operation is performed on a first specific bit in the first bit stream to obtain the second bit stream; and when the first operation result is that the first identification bit is same as the second identification bit, the first bit stream is used as the second bit stream.

12. The decoding device of claim 10, wherein processing the first bit stream according to the first operation result to obtain the second bit stream comprises:

when the first operation result is that the first identification bit is same as the second identification bit, an inversion logic operation is performed on a first specific bit in the first bit stream to obtain the second bit stream; and when the first operation result is that the first identification bit is different from the second identification bit, the first bit stream is used as the second bit stream.

13. The decoding device of claim 11, wherein the first specific bit is selected from last five bits of the first bit stream.

14. The decoding device of claim 12, wherein
the first identification bit and the second identification bit are a 0th bit and a first bit in the first bit stream, respectively, and the first specific bit is a seventh bit in the first bit stream;
the third identification bit and the fourth identification bit are a sixth bit and a seventh bit in the second bit stream, respectively; and
the two specific bits in the third bit stream are a 0th bit and a third bit in the third bit stream, respectively.

15. The decoding device of claim 12, wherein
the first identification bit and the second identification bit are a third bit and a fourth bit in the first bit stream, respectively; and
the third identification bit and the fourth identification bit are an eighth bit and a ninth bit in the second bit stream, respectively.

16. The decoding device of claim 12, wherein
the first identification bit and the second identification bit are a 0th bit and a first bit in the first bit stream, respectively; and
the third identification bit and the fourth identification bit are a first bit and a second bit in the second bit stream, respectively.

17. The decoding device of claim 10, wherein processing the second bit stream according to the second operation result to obtain the third bit stream comprises:

when the second operation result is that the third identification bit is different from the fourth identification bit, an inversion logic operation is performed on a second specific bit and a third specific bit in the second bit stream to obtain the third bit stream, and when the second operation result is that the third identification bit is same as the fourth identification bit, the inversion logic operation is performed on a fourth specific bit and a fifth specific bit in the second bit stream to obtain the third bit stream.

18. The decoding device of claim 17, wherein the second specific bit, the third specific bit, the fourth specific bit, and the fifth specific bit are selected from last five bits of the second bit stream, wherein the second specific bit is not adjacent to the third specific bit, and the fourth specific bit is not adjacent to the fifth specific bit.

19. The decoding device of claim 17, wherein the second specific bit and the third specific bit are a sixth bit and a ninth bit in the second bit stream, respectively, and the fourth specific bit and the fifth specific bit are a fifth bit and an eighth bit in the second bit stream.

20. The decoding device of claim 10, wherein processing the second bit stream according to the second operation result to obtain the third bit stream comprises:

when the second operation result is that the third identification bit is same as the fourth identification bit, an inversion logic operation is performed on a second specific bit and a third specific bit in the second bit stream to obtain the third bit stream, and when the second operation result is that the third identification bit is different from the fourth identification bit, the inversion logic operation is performed on a fourth specific bit and a fifth specific bit in the second bit stream to obtain the third bit stream.

\* \* \* \* \*